(12) United States Patent
Kurita et al.

(10) Patent No.: US 7,151,981 B2
(45) Date of Patent: Dec. 19, 2006

(54) METHODS AND APPARATUS FOR POSITIONING A SUBSTRATE RELATIVE TO A SUPPORT STAGE

(75) Inventors: Shinichi Kurita, San Jose, CA (US); Emanuel Beer, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 56 days.

(21) Appl. No.: 10/782,507

(22) Filed: Feb. 19, 2004

(65) Prior Publication Data

US 2004/0217545 A1 Nov. 4, 2004

Related U.S. Application Data

(60) Provisional application No. 60/448,972, filed on Feb. 20, 2003, provisional application No. 60/448,821, filed on Feb. 20, 2003, provisional application No. 60/448,855, filed on Feb. 20, 2003.

(51) Int. Cl.
*G06F 7/00* (2006.01)

(52) U.S. Cl. .................. 700/218; 414/935; 414/936; 414/941

(58) Field of Classification Search ........... 700/218, 700/213, 214, 245, 248; 414/935, 936, 941
See application file for complete search history.

(56) References Cited

U.S. PATENT DOCUMENTS

| | | | | |
|---|---|---|---|---|
| 4,407,627 A | * | 10/1983 | Sato et al. | 414/757 |
| 4,628,238 A | | 12/1986 | Smulders et al. | |
| 4,628,986 A | | 12/1986 | Southam | |
| 4,655,584 A | * | 4/1987 | Tanaka et al. | 355/53 |
| 5,140,242 A | * | 8/1992 | Doran et al. | 318/640 |
| 5,374,147 A | * | 12/1994 | Hiroki et al. | 414/217 |
| 5,484,252 A | * | 1/1996 | Mutoh | 414/783 |
| 5,969,441 A | | 10/1999 | Loopstra et al. | |
| 6,087,053 A | * | 7/2000 | Hara | 430/30 |
| 6,155,773 A | * | 12/2000 | Ebbing et al. | 414/744.5 |
| 6,158,946 A | | 12/2000 | Miyashita | |
| 6,327,034 B1 | | 12/2001 | Hoover et al. | |
| 6,499,367 B1 | | 12/2002 | Saeki | |
| 2002/0051697 A1 | | 5/2002 | Ko et al. | |
| 2004/0245956 A1 | * | 12/2004 | Kurita et al. | 318/560 |

FOREIGN PATENT DOCUMENTS

| | | |
|---|---|---|
| CN | 86101820 A | 9/1987 |
| CN | 2222404 Y | 3/1996 |
| EP | 1 067 589 A2 | 1/2001 |
| JP | 04149917 | 5/1992 |
| JP | 06089845 | 3/1994 |
| JP | 06204321 | 7/1994 |
| JP | 08313815 | 11/1996 |
| JP | 09090308 | 4/1997 |
| JP | 09152569 | 6/1997 |
| JP | 2001-358202 | 12/2001 |
| JP | 2001358202 | 12/2001 |
| JP | 2002308420 | 10/2002 |

* cited by examiner

*Primary Examiner*—Khoi H. Tran
(74) *Attorney, Agent, or Firm*—Dugan & Dugan

(57) ABSTRACT

In a first aspect, a substrate positioning system includes a plurality of pushers arranged in a spaced relation about a stage adapted to support a substrate. Each pusher is adapted to assume a retracted position so as to permit the substrate to be loaded onto and unloaded from the stage, extend toward an edge of the substrate that is supported by the stage, contact the edge of the substrate, and continue extending so as to cause the substrate to move relative to the stage until the substrate is calibrated to the stage. Numerous other aspects are provided.

11 Claims, 10 Drawing Sheets

METHODS AND APPARATUS FOR POSITIONING A SUBSTRATE RELATIVE TO A SUPPORT STAGE

The present application claims priority from U.S. Provisional Patent Application Ser. No. 60/448,972, filed Feb. 20, 2003, which is hereby incorporated by reference herein in its entirety.

CROSS REFERENCE TO RELATED APPLICATIONS

The present application is related to the following co-pending U.S. Provisional Patent Applications:

U.S. Provisional Patent Application Ser. No. 60/448,821, filed Feb. 20, 2003, and titled "METHODS AND APPARATUS FOR DETERMINING A POSITION OF A SUBSTRATE RELATIVE TO A SUPPORT STAGE"; and U.S. Provisional Patent Application Serial No. 60/448,855, filed Feb. 20, 2003, and titled "METHODS AND APPARATUS FOR POSITIONING A SUBSTRATE RELATIVE TO A SUPPORT STAGE".

Each of these provisional patent applications is hereby incorporated by reference herein in its entirety.

FIELD OF THE INVENTION

The present invention relates generally to substrate processing, and more particularly to positioning a substrate relative to a support stage.

BACKGROUND OF THE INVENTION

During the manufacture of flat panel displays, a glass substrate may be placed on a support stage for processing and/or testing purposes. Typical substrate processing may include lithography, deposition, etching, annealing, etc., and typical substrate testing may include verifying the operation of thin film transistors formed on the substrate, e-beam inspection, defect detection, etc.

To accurately identify device and/or substrate locations for processing and/or testing, and/or to reduce device/location search times, a position of a substrate relative to a support stage should be determined. Accordingly, improved methods and apparatus for quickly and accurately positioning a substrate relative to a support stage would be desirable.

SUMMARY OF THE INVENTION

In a first aspect of the invention, a substrate positioning system is provided that is adapted to adjust a position of a substrate relative to a stage that supports the substrate. The substrate positioning system includes a plurality of pushers arranged in a spaced relation about the stage. Each pusher is adapted to (1) assume a retracted position so as to permit the substrate to be loaded onto and unloaded from the stage; (2) extend toward an edge of the substrate that is supported by the stage; (3) contact the edge of the substrate; and (4) continue extending so as to cause the substrate to move relative to the stage along the stage until the substrate is calibrated to the stage (e.g., until the substrate is aligned with an x-y coordinate system having a known position and/or orientation relative to the stage).

In a second aspect of the invention, a pushing device is provide that includes a pusher adapted to (1) extend toward an edge of a substrate that is supported by a stage; (2) contact the edge of the substrate while the substrate is supported by the stage; and (3) continue extending so as to cause the substrate to translate relative to the stage toward one or more stops until the substrate contacts the one or more stops.

In a third aspect of the invention, a method is provided for adjusting a position of a substrate relative to a stage that supports the substrate. The method includes the steps of (1) providing a plurality of pushers and stops in a spaced relation around a stage that is adapted to support a substrate; (2) causing each pusher to extend toward an edge of the substrate; (3) causing each pusher to contact the edge of the substrate; and (4) causing each pusher to continue extending so as to cause the substrate to translate relative to the stage toward one or more of the stops until the substrate contacts the one or more stops. Numerous other aspects are provided, as are methods and apparatus in accordance with these and other aspects of the invention.

Other features and aspects of the present invention will become more fully apparent from the following detailed description of exemplary embodiments, the appended claims and the accompanying drawings.

DETAILED DESCRIPTION

Conventional manufacturing methods for the production of glass substrates, e.g. for use in flat panel displays and other applications, may produce substrates that vary in size.

For example, a glass substrate having nominal width and length dimensions of 1 meter×1.2 meter may have a variation of up to +/−0.5 millimeters per side or more.

Such variation in glass substrate dimensions can cause problems during device processing and/or testing. For example, a lithographic system may rely on one or more electron beams (e-beams) to search for registration marks on the surface of a substrate during mask alignment. An e-beam will function best when the surface area of the substrate within which the e-beam is expected to scan, e.g. in order to find a particular registration mark therein, is minimized. However, variations in substrate size, as described above, tend to increase the area in which an e-beam must scan in order to locate registration marks. Any increase in e-beam scanning area may increase the time required to locate registration marks. Since the printing of a mask on the surface of a substrate must be delayed until proper alignment is established, longer scan times directly affect the efficiency of the lithographic process. Moreover, long e-beam scanning times may damage devices formed on a substrate due to excessive charge that may build up during the e-beam scanning process.

In a first aspect of the present invention, methods and apparatus disclosed herein are adapted to subject a substrate placed on a support stage, which can be a test stage or other type of substrate processing stage, to positional and/or orientational adjustment relative to the support stage. Preferably, positioning and/or orientation of the substrate in accordance with the first aspect of the invention will result in at least rough alignment of the substrate relative to a known position and orientation of the support stage. In a particular embodiment, such rough alignment may be performed despite variations in substrate size, thereby reducing and/or minimizing e-beam scan areas and/or scan times during lithographic processing. As described further below, such substrate alignment may be performed quickly and inexpensively, and may be employed with other substrate processing steps and/or during device testing.

Figure 1A:
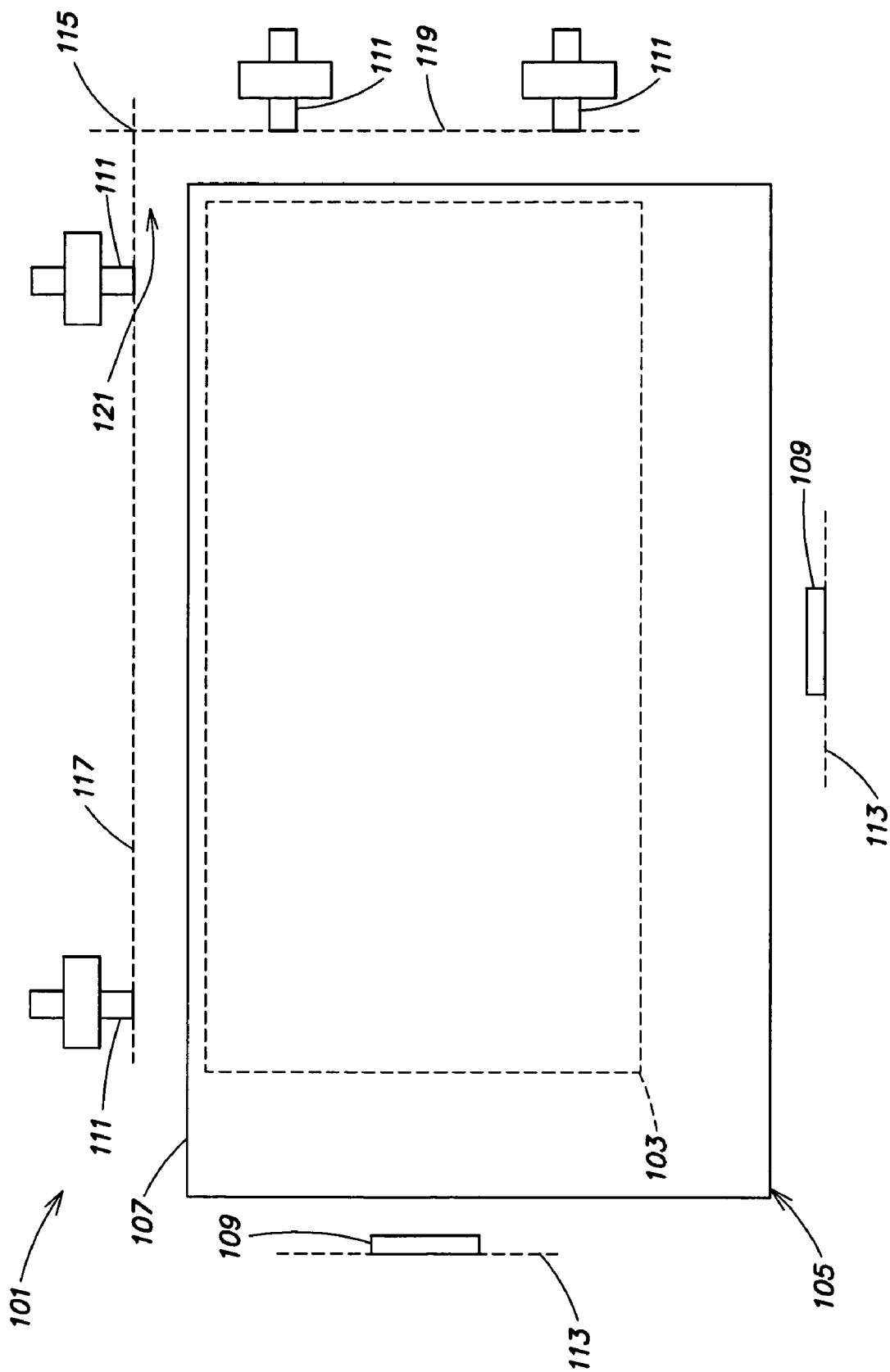
FIG. 1A is a schematic top view of an exemplary embodiment of a substrate positioning system in accordance with the present invention adjacent a support stage.

FIG. 1A is a schematic top view of an exemplary embodiment of a substrate positioning system 101 in accordance with the present invention. The substrate positioning system 101 is positioned adjacent a support stage 103 that supports a substrate 105 having an edge 107. As shown in FIG. 1A, the substrate positioning system 101 includes a plurality of pushers 109 and stops 111 arranged in a spaced relation around the support stage 103. Each pusher 109 is adapted to assume a retracted position 113 such that the substrate 105 may be conveniently loaded onto and removed from the support stage 103 by one of a variety of loading/removing means (not shown), e.g. a human operator, or a robot utilizing an end effector to lower and/or lift the substrate 105 relative to the support stage 103, etc.

The substrate positioning system 101 is adapted to cause each pusher 109 to extend from its retracted position 113 toward the substrate 105, to contact the edge 107 of the substrate 105, and to apply a pushing force (not shown) to the edge 107 of the substrate 105. More specifically, the substrate positioning system 101 may employ the plurality of pushers 109 to move the substrate 105 relative to (e.g. slide the substrate 105 atop) the support stage 103 while the substrate 105 is being supported by the support stage 103. For example, the substrate positioning system 101 may adjust, at least in part by the above-described movement of the substrate 105 caused by the pushers 109, a position and/or an orientation of the substrate 105 relative to the support stage 103. Such adjustments may calibrate the position and the orientation of the substrate 105 relative to the support stage 103 so that, after the adjustment, the edge 107 of the substrate 105 will be aligned with a predefined x-y coordinate system 115 having a known position and orientation relative to the support stage 103 (e.g., a first vertically-oriented datum plane 117 (shown in profile), and a second vertically-oriented datum plane 119 (also shown in profile) substantially perpendicular to the first vertically-oriented datum plane 117).

As illustrated in FIG. 1A, the stops 111 of the substrate positioning system 101 occupy predefined positions and/or orientations relative to the support stage 103 so as to collectively define a substrate edge trap 121 that is aligned with the predefined x-y coordinate system 115 of the support stage 103. Preferably, the substrate edge trap 121 is shaped to correspond to an edge of a substrate (e.g. the edge 107 of the substrate 105) to be loaded onto the support stage 103.

Figure 1B:
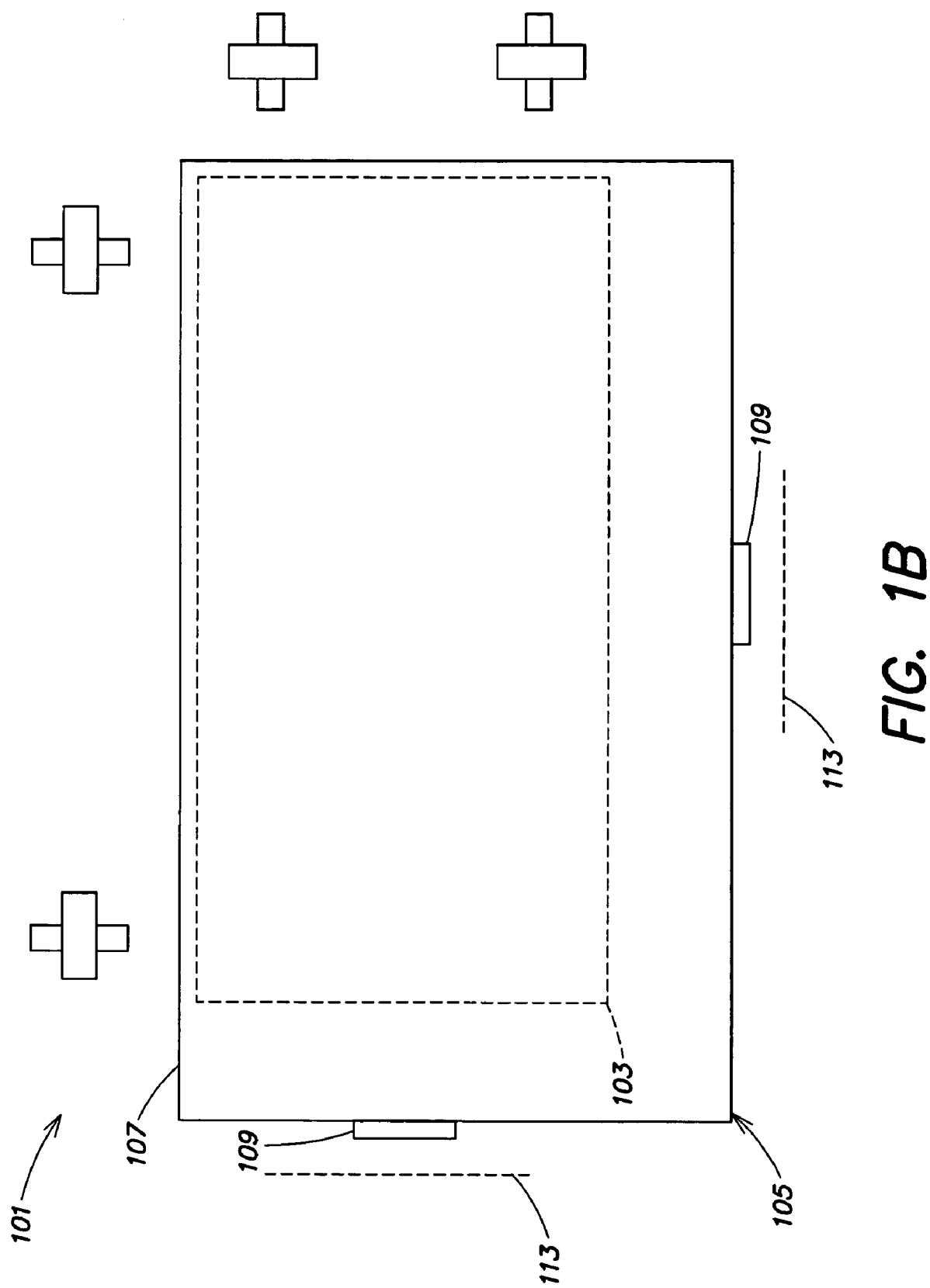
FIG. 1B is a schematic top view of the substrate positioning system of FIG. 1A wherein the configuration of the substrate positioning system is such that each pusher is in contact with the edge of a substrate.

FIG. 1B is a schematic top view of the exemplary embodiment of the substrate positioning system 101 of FIG. 1A wherein each pusher 109 is in contact with the edge 107 of the substrate 105. In the embodiment shown, each pusher 109 is adapted to extend in the direction of the support stage 103 along a generally straight-line path (not shown) from the retracted position 113 associated with the pusher 109 and to contact a portion of the edge 107 of the substrate 105. Non-linear extension paths also may be employed.

Figure 1C:
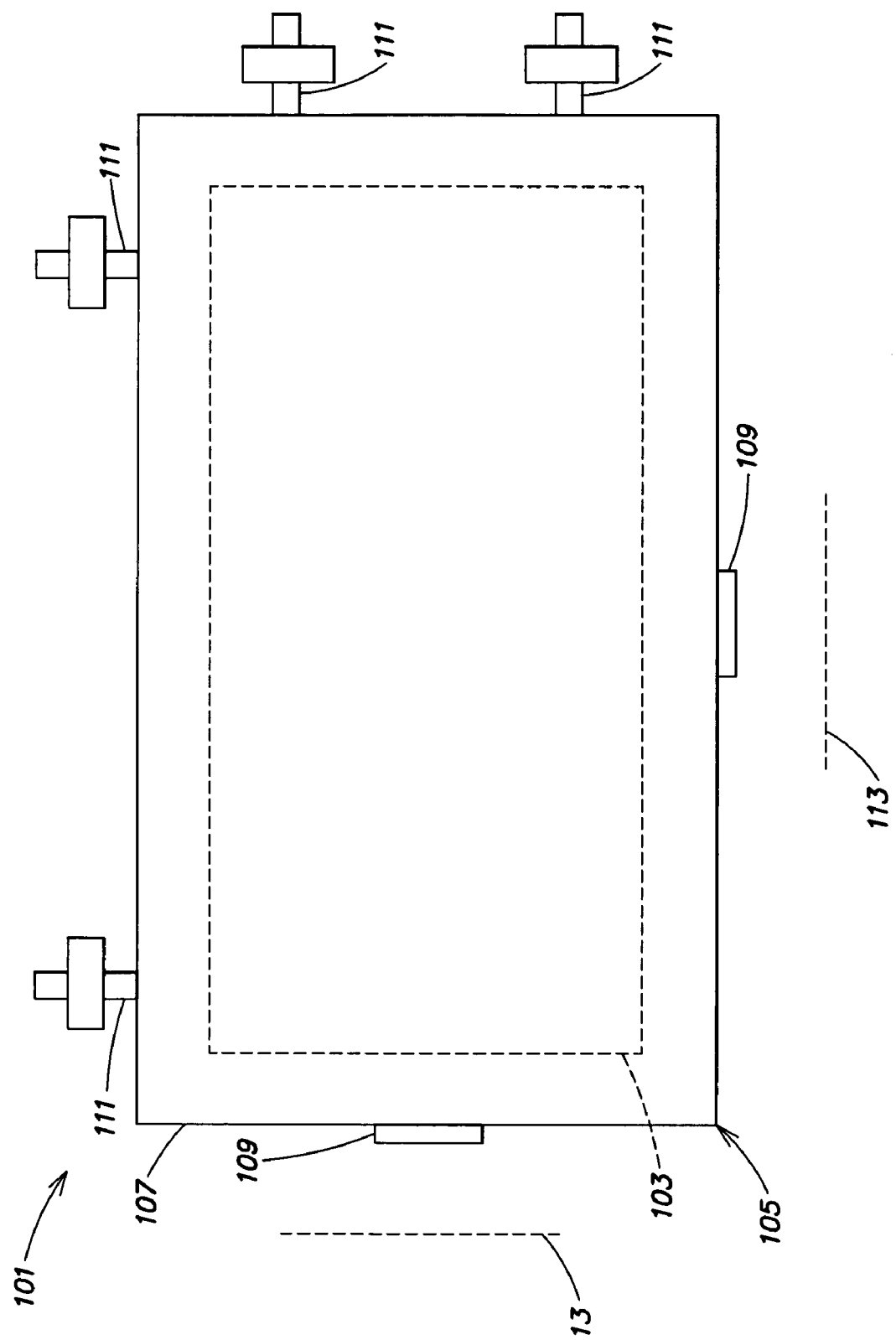
FIG. 1C is a schematic top view of the substrate positioning system of FIG. 1A illustrating a configuration of the substrate positioning system wherein a substrate, supported by the support stage, has been calibrated to the support stage by the substrate positioning system.

FIG. 1C is a schematic top view of the exemplary embodiment of the substrate positioning system 101 of FIG. 1A wherein the substrate 105, still supported by the support stage 103, has been calibrated to the support stage 103 by the substrate positioning system 101 such that the edge 107 of the substrate 105 is aligned with the predefined x-y coordinate system 115 (FIG. 1A) of the support stage 103. As described briefly above, the substrate positioning system 101 may employ the pushing force of the pushers 109 to adjust the position of the substrate 105 relative to the support stage 103. For example, the substrate positioning system 101 may move the substrate 105 from the position of FIG. 1A to the position of FIG. 1C. In the latter position of the substrate 105, two sides of the edge 107 of the substrate 105 are aligned with the first vertically-oriented datum plane 117 (FIG. 1A) and the second vertically-oriented datum plane 119 (FIG. 1A) of the predefined x-y coordinate system 115 (FIG. 1A). In at least one embodiment of the invention, once the substrate 105 is flush against the stops 111 (FIG. 1C), substrate positioning system 101 directs each pusher 109 to cease applying a pushing force (not shown) to the edge 107 of the substrate 105. Further, each pusher 109 thereafter may be directed to retract from the substrate 105 and the support stage 103 to the retracted position 113 associated with the pusher 109, as illustrated in FIG. 1A.

Figure 2:
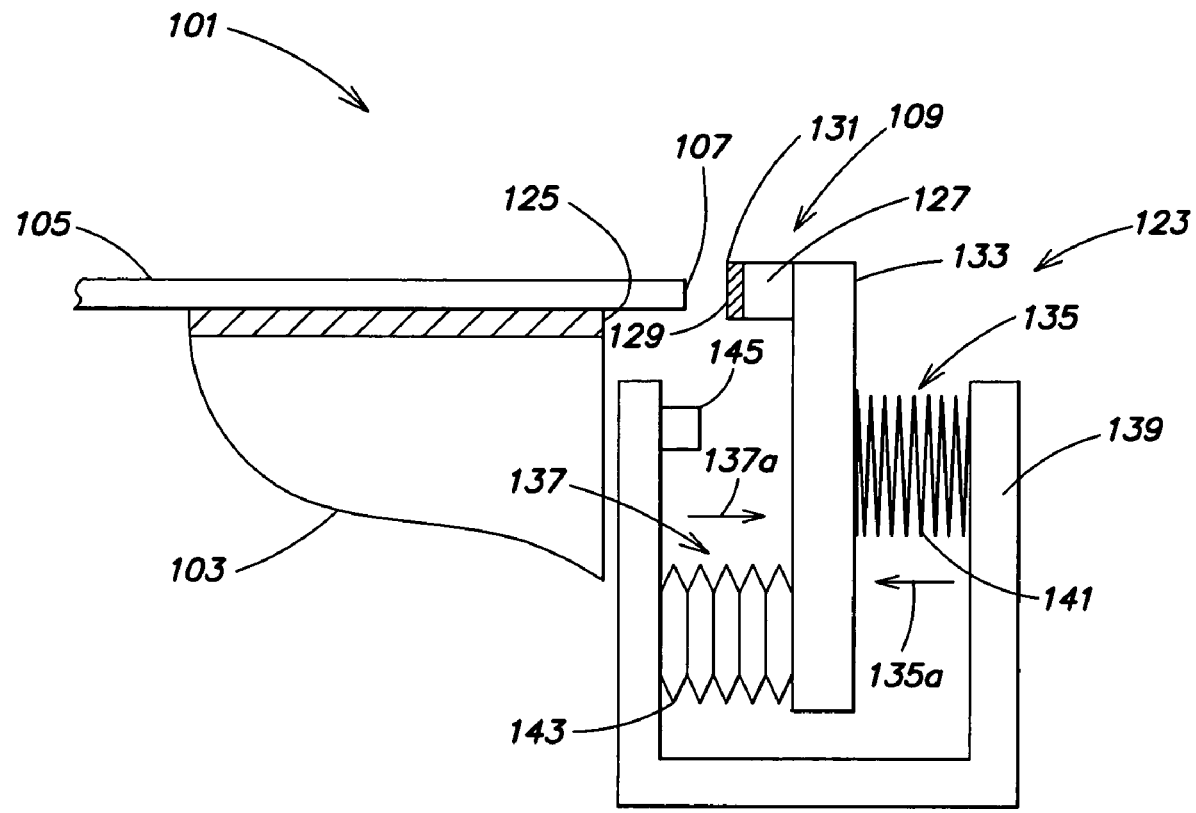
FIG. 2 is a schematic side elevational view of an exemplary embodiment of a pushing device in accordance with the present invention.

FIG. 2 is a schematic side elevational view of an exemplary pushing device 123 in accordance with the present invention that may include the pusher 109 of the substrate positioning system 101 illustrated in FIGS. 1A–1C. The pushing device 123 is adapted to cause the pusher 109 to move toward the substrate 105 and/or the support stage 103 and move the substrate 105 relative to the support stage 103. (As shown in FIG. 2, to reduce scratching of the substrate 105 by the support stage 103 during this motion, the support stage 103 may be coated with a low friction coating 125, such as Teflon® (e.g., polytetrafluoroethylene) or another similar material.) The pushing device 123 also is adapted to cause the pusher 109 to move away from the substrate 105 and/or the support stage 103, e.g. when a substrate is to be loaded onto or unloaded from the support stage 103.

Each pusher 109 of the substrate positioning system 101 comprises a body 127, which in at least one embodiment may be rigid so as to facilitate precise adjustment of the position and orientation of the substrate 105. The body 127 of each pusher 109 may further comprise a pushing surface 129 adapted to contact the edge of a substrate (e.g. the edge 107 of the substrate 105). In one or more embodiments of the invention, the pushing surface 129 of the body 127 of each pusher 109 may include a low friction coating 131 (e.g., Teflon® or the like). Such a low friction coating may be advantageous when a substrate must slide against a pusher 109 during positioning with the substrate positioning system 101 (described below).

In addition to the pusher 109, the pushing device 123 further comprises a pusher support 133 of FIG. 2 to which the pusher 109 is coupled, (e.g., at an elevation of the edge 107 of the substrate 105). In other embodiments of the pushing device 123 (not shown), the pusher 109 and the pusher support 133 are not separate parts of an assembly, but are separate features of a single part of unitary construction.

The pushing device 123 also includes (1) a biasing device 135 adapted to contact and/or couple with the pusher support 133 and apply a biasing force (represented by arrow 135a) to the pusher support 133; (2) a bias-defeating device 137 adapted to contact and/or couple with the pusher support 133 and apply a retracting force (represented by arrow 137a) to the pusher support 133; and (3) a common frame 139 to which the biasing device 135 and the bias-defeating device 137 are mounted and against which the biasing device 135 and the bias-defeating device 137 are adapted to press during the generation and application of the respective biasing and retracting forces described above.

In the exemplary embodiment of the pushing device 123 illustrated in FIG. 2, the biasing device 135 comprises a coil spring 141. Those skilled in the art will recognize that a variety of other embodiments for the biasing device 135 may be employed. For example, the biasing device 135 may include an air cylinder, a Belleville washer, a leaf spring, etc.

In at least one embodiment, the bias-defeating device 137 comprises a bellows 143. Alternatively, the bias-defeating device 137 may include a motor driven lead screw or similar mechanism.

As shown in FIG. 2, the common frame 139 may be adapted to restrict the motion of the pusher 109 so as to prevent impact between the pusher 109 (and/or the pusher support 133) and the support stage 103. For example, the common frame 139 may include a stop 145 adapted to contact the pusher support 133 and prevent the pusher support 133 from moving any further toward the support stage 103 and/or the substrate 105 once contact occurs.

In operation, the pushing device 123 activates the bias-defeating device 137 to begin applying a retracting force to the pusher support 133, e.g. assuming the pusher support 133 is in an extended position (not shown) near the support stage 103 in FIG. 2 (this leftmost limit of the range of motion of the pusher support 133 of FIG. 2 is discussed further below). The retracting force must become larger than the biasing force of the biasing device 135 for the overall motive force of the pushing device 123 to cause the pusher 109 to begin to move away from the support stage 103 and/or the substrate 105. As the pusher 109 moves away from the support stage 103, the biasing device 135 becomes increasingly compressed.

The behavior of the bias-defeating device 137 can be such that the pusher 109 moves relatively quickly away from the support stage 103, depending on the magnitude of the retracting force relative to the magnitude of the biasing force. Depending on the nature of the biasing device 135, as the biasing device 135 becomes increasingly compressed, the biasing force the biasing device 135 generates may increase. In the case of the bias-defeating device 137 comprising the bellows 143 as described above, the bellows 143 can be inflated rapidly to cause the bellows 143 to quickly expand to move the pusher 109 away from the support stage 103.

The pusher 109 may be moved away from the support stage 103 until the pusher 109 and/or the pusher support 133 reaches a limit of motion (e.g., the retracted position 113 for the pusher 109 as shown in FIG. 1A). This limit can be established in many different ways. For example, the pusher support 133 may contact the common frame 139, or the coil spring 141 may reach a fully compressed state that prevents further motion of the pusher support 133. Those skilled in the art will recognized other ways to establish such a limit.

Motion of the pusher 109 toward the support stage 103 occurs when the retracting force generated by the bias-defeating device 137 is weaker than the biasing force generated by the biasing device 135. Controlled motion of the pusher 109 toward the support stage 103 is preferred since contact with the edge 107 of the substrate 105 is preferably established when the pusher 109 moves at a relatively low speed (e.g., to preclude a damaging impact between the pusher 109 and the edge 107 of the substrate 105, or between stops 111 and the edge 107 of the substrate 105).

Such controlled motion of the pusher 109 may be achieved, for example, by gradually reducing the retracting force of the bias-defeating device 137 such that the pusher 109 begins to move away from the retracted position 113 and toward the support stage 103 and/or the substrate 105 at a relatively slow speed. For example, in the case of the bias-defeating device 137 comprising the bellows 143 as described above, the bellows 143 can be deflated gradually to cause the magnitude of the retracting force generated by the bellows 143 to slowly lessen, and after the deflation has proceeded sufficiently, the biasing force generated by the biasing device 135 will dominate and cause the pusher 109 to move toward the support stage 103. When the biasing device 135 comprises the coil spring 141, the biasing force will be at its peak as the pusher 109 begins to move away from its retracted position, and will weaken thereafter as the coil spring 141 relaxes (e.g., continued deflation of the bellows 143 may be necessary for the biasing force to remain dominant as the coil spring 141 decompresses).

The pusher 109 may be moved toward the support stage 103 direction, until the pusher 109 reaches a limit of motion in that direction. This limit may be established by the pushing force applied to the edge 107 of the substrate 105 by the pusher 109 being fully resisted by an equal and opposite force applied to the edge 107 of the substrate 105 by one or more of the stops 111 (FIG. 1A). Lacking such resistance from the stops 111, the motion limit of the pusher 109 may be established by the pusher support 133 directly contacting the stop 145 of the pushing device 123. The motion limit alternatively may be set by the bias-defeating device 137 reaching a fully compressed state that prevents further motion of the pusher support 133. Other ways of establishing a limit may be employed, such as via the use of sensors (FIG. 6) and a controller (FIG. 6) as described below.

Figure 3:
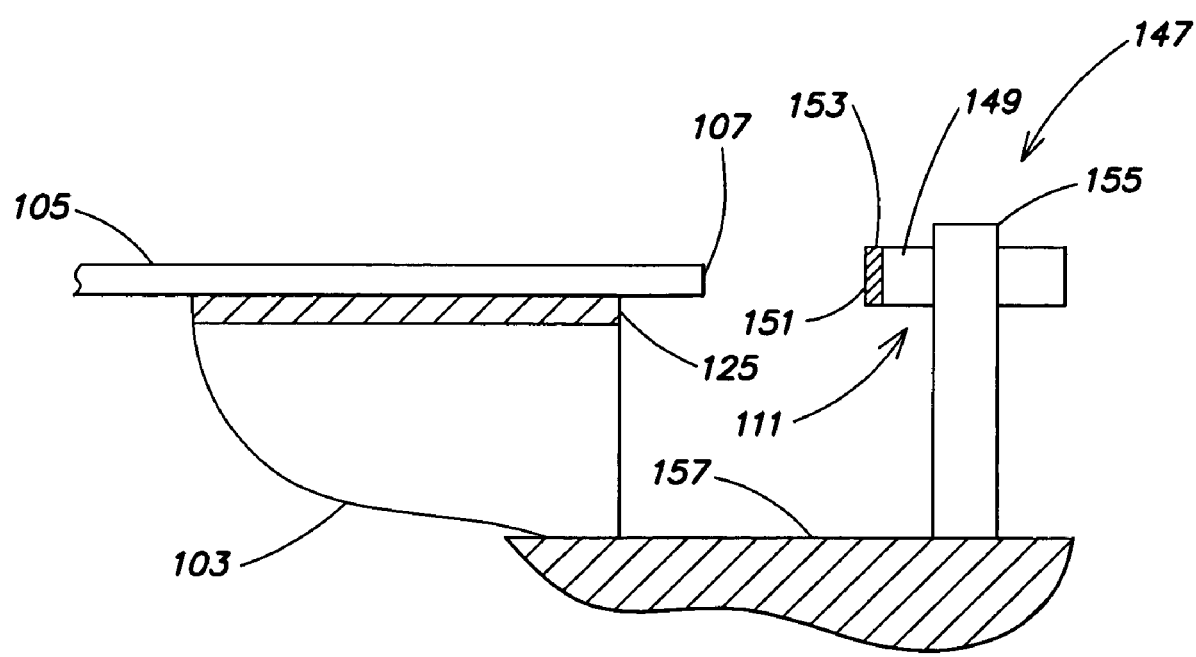
FIG. 3 is a schematic side elevational view of an exemplary embodiment of a stopping device in accordance with the present invention.

FIG. 3 is a schematic side elevational view of an exemplary stopping device 147 in accordance with the present invention that may include the stop 111 of the substrate positioning system 101 illustrated in FIGS. 1A–1C. The stopping device 147 is adapted to situate the stop 111 at an elevation of the edge 107 of the substrate 105, confine the stop 111 to an orientation suitable for contact between the stop 111 and the edge 107 of the substrate 105, and brace the stop 111 (e.g., in circumstances when pushing forces associated with the pushers 109 are transmitted through the substrate 105 to the stop 111) so that the stop 111 maintains a predefined x-y position relative to the support stage 103. The substrate positioning system 101 comprises a plurality of the stopping devices 147, each stopping device 147 corresponding to one of the stops 111 (FIG. 1A).

As shown in FIG. 3, each stop 111 of the substrate positioning system 101 includes a body 149, which may have a stopping surface 151 adapted to contact the edge of a substrate (e.g. the edge 107 of the substrate 105). In one or more embodiments of the invention, the stopping surface 151 of the body 149 of each stop 111 may include a low friction coating 153 (e.g., Teflon® of the like). Such a low friction coating may be advantageous when a substrate must slide against a stop 111 during positioning with the substrate positioning system 101 (described below).

In some such embodiments, the stopping surface 151 of the stop 111 may be curved. In other embodiments, the stopping surface 151 of the stop 111 may be substantially flat. Other configurations may be employed.

The stopping device 147 further comprises a stop support 155, to which the stop 111 is coupled (e.g., at an elevation of the edge 107 of the substrate 105). The stop support 155 may be affixed to, and extend upward from, a base 157 to which the support stage 103 is affixed. Alternatively, the stop support 155 may be coupled to the support stage 103. Preferably, the stop support 155 occupies a substantially constant x-y position relative to the support stage 103 (e.g., to coincide with or define the x-y coordinate system 115 of FIG. 1A).

In a preferred mode of operation, the stop 111 is adapted to prevent the substrate 105 from moving relative to the support stage 103 any farther than a limit set by the stop 111 (e.g., when the edge 107 of the substrate 105 is in direct contact with the stopping surface 151 of the body 149 of the stop 111). The stopping device 147 is adapted to brace the stop 111 against pushing forces of the pushers 109 so as to substantially prevent movement of the stop 111 in response to the pushing forces.

Figure 4:
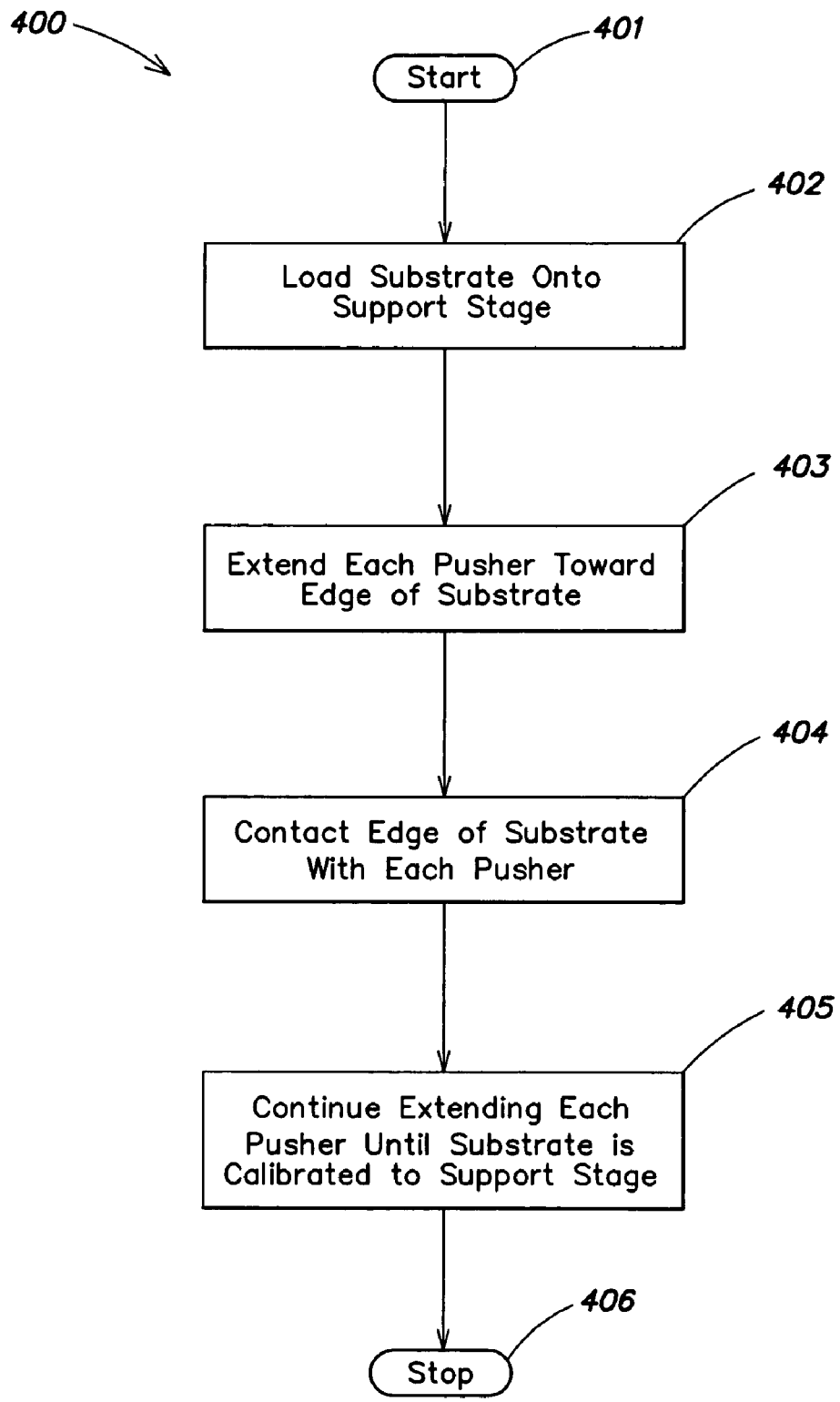
FIG. 4 is a flowchart that illustrates an exemplary process for calibrating a substrate to a predefined coordinate system of a support stage while the support stage supports the substrate.

FIG. 4 is a flowchart that illustrates an exemplary inventive process 400 for calibrating a substrate to a predefined coordinate system of a support stage while the support stage supports the substrate. Referring to FIG. 4, as well as to FIGS. 1A–1C, 2 and 3, the process 400 begins with a step 401. In step 402, assuming the pushers 109 are in their retracted positions 113, the substrate 105 is loaded onto the support stage 103 (FIG. 1A). Step 402 may be accomplished via any appropriate means or processes, e.g. intervention by one or more human operators or by a robot equipped with an end effector, such that the substrate 105 is caused to rest on the support stage 103 at an appropriate preliminary position relative to the support stage 103, e.g., a position that enables the substrate positioning system 101 to subsequently adjust the position and/or orientation of the substrate 105 relative to the support stage 103.

In step 403, each pusher 109 is caused to extend toward the edge 107 of the substrate 105 as necessary so as to achieve contact with the edge 107 of the substrate 105. In an embodiment of the step 403, each pushing device 123 (FIG. 2) causes the biasing force 135a generated by the biasing device 135 (FIG. 2) to dominate any retracting force 137a generated by the bias-defeating device 137 (FIG. 2). For example, the pressure within the bellows 143 may be reduced to decrease the retracting force that otherwise holds each pusher 109 in the retracted position 113. In this manner, each pusher 109 will move toward the edge 107 of the substrate 105.

In step 404, each pusher 109 of the substrate positioning system 101 contacts the edge 107 of the substrate 105. The pushers 109 need not contact the edge 107 of the substrate 105 simultaneously, e.g. as each pusher 109 extends through whatever distance is necessary to achieve contact with that portion of the edge 107 of the substrate 105 which lies in the path of that pusher 109.

In one embodiment of the process 400, once contact is achieved between a particular pusher 109 and the edge 107 of the substrate 105 (step 404), that pusher 109 remains in substantially continuous contact with the edge 107 of the substrate 105 during any subsequent motion between the substrate 105 and the support stage 103. In another embodiment of the process 400, once contact is achieved between a particular pusher 109 and the edge 107 of the substrate 105 (step 404), subsequent interruptions in contact between that pusher 109 and the edge 107 of the substrate 105 during motion between the substrate 105 and the support stage 103 may occur.

In step 405 each pusher 109 continues to extend as necessary so as to cause the position of the substrate 105 relative to the support stage 103 to become calibrated to the predefined x-y coordinate system 115 of the support stage 103. For example, each pushing device 123 of the substrate positioning system 101 may cause its respective pusher 109 to extend until the edge 107 of the substrate 105 opposite the pusher 109 contacts and/or is pressed against the stops 111 toward which the pusher 109 travels during positioning of the substrate 105 on the support stage 103. In such an embodiment of the process 400, at the time the pushing device 123 causes the pusher 109 to cease extending, the substrate 105 may be trapped or "gripped" between the pusher 109 and one or more stops 111 of the substrate positioning system 101.

In step 406 the process 400 concludes. Although not described above, one or more of the pushers 109, or all of the pushers 109, may be caused to individually retract to their respective retracted position 113 at the conclusion of the process 400 in preparation for a subsequent unloading of the substrate 105 from the support stage 103. Alternatively, the pushing forces generated by one or more of the pushers 109 on the edge 107 of the substrate 105 can be continued, e.g. to ensure proper positioning of the substrate 105 relative to the support stage 103 during a subsequent processing step, such as an e-beam search, or a defect detection routine. One or more of steps 401–406 of the process 400 may be performed by a controller (not shown) that is operable to control positioning of each pusher 109 (e.g., by controlling gas flow to/from the bellows 143 of each pushing device 123). Further, one or more of the steps 401–406 may be implemented as one or more computer program products stored in a suitable computer readable medium (e.g., a carrier wave signal, hard drive, random access memory, etc.)

Figure 5A:
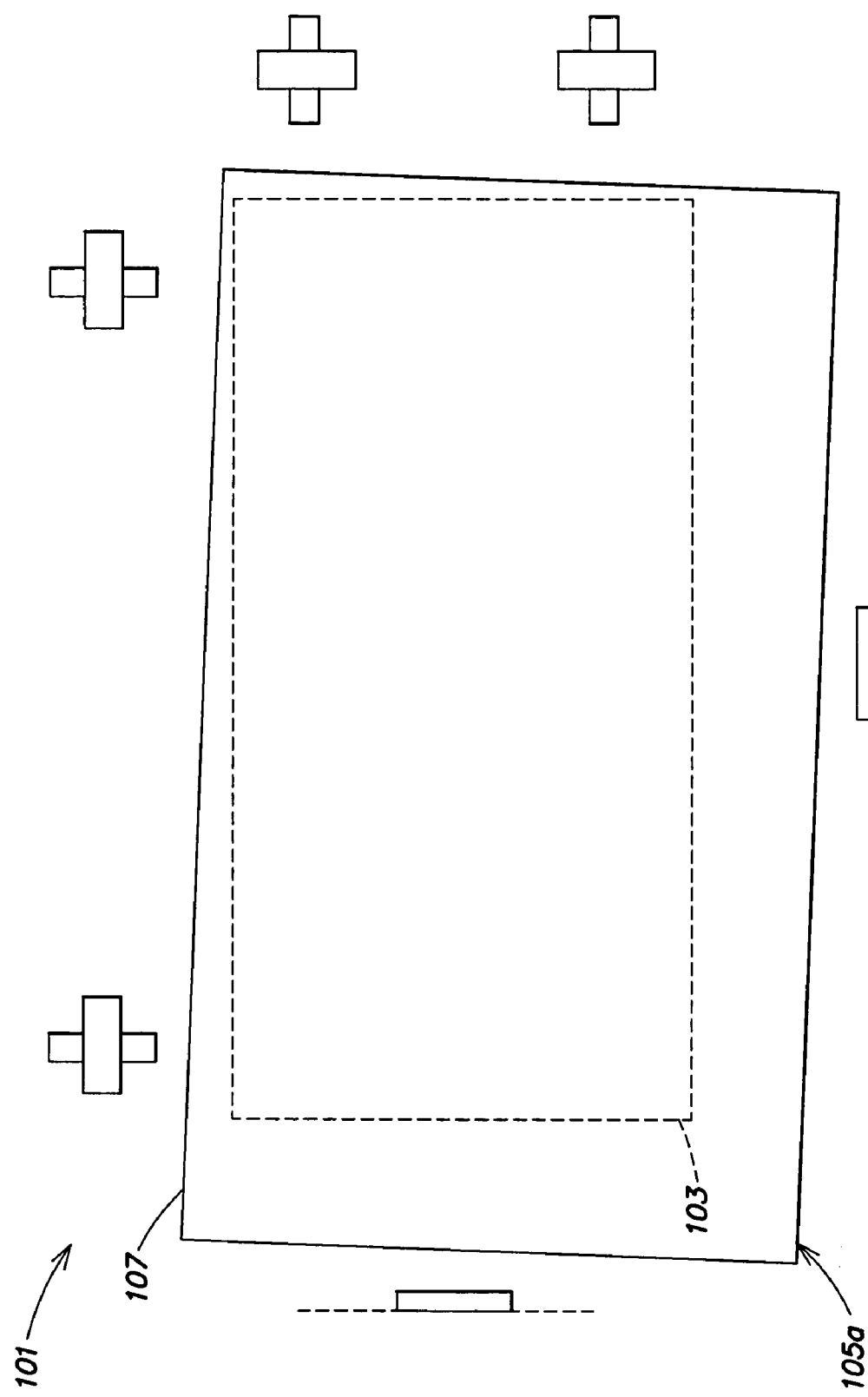
FIG. 5A is a schematic top view of the substrate positioning system of FIGS. 1A–1C wherein the substrate is misaligned with the support stage.

FIG. 5A is a schematic top view of the substrate positioning system 101 of FIGS. 1A–1C, wherein a substrate 105a is misaligned with the support stage 103 following loading onto the support stage 103. Referring to FIG. 5A, despite the misaligned orientation of the substrate 105a relative to the support stage 103, the substrate positioning system 101 may still calibrate the position and/or the orientation of the substrate 105a relative to the support stage 103 so that the edge 107 of the substrate 105a is aligned with the predefined x-y coordinate system 115 (FIG. 1A).

Figure 5B:
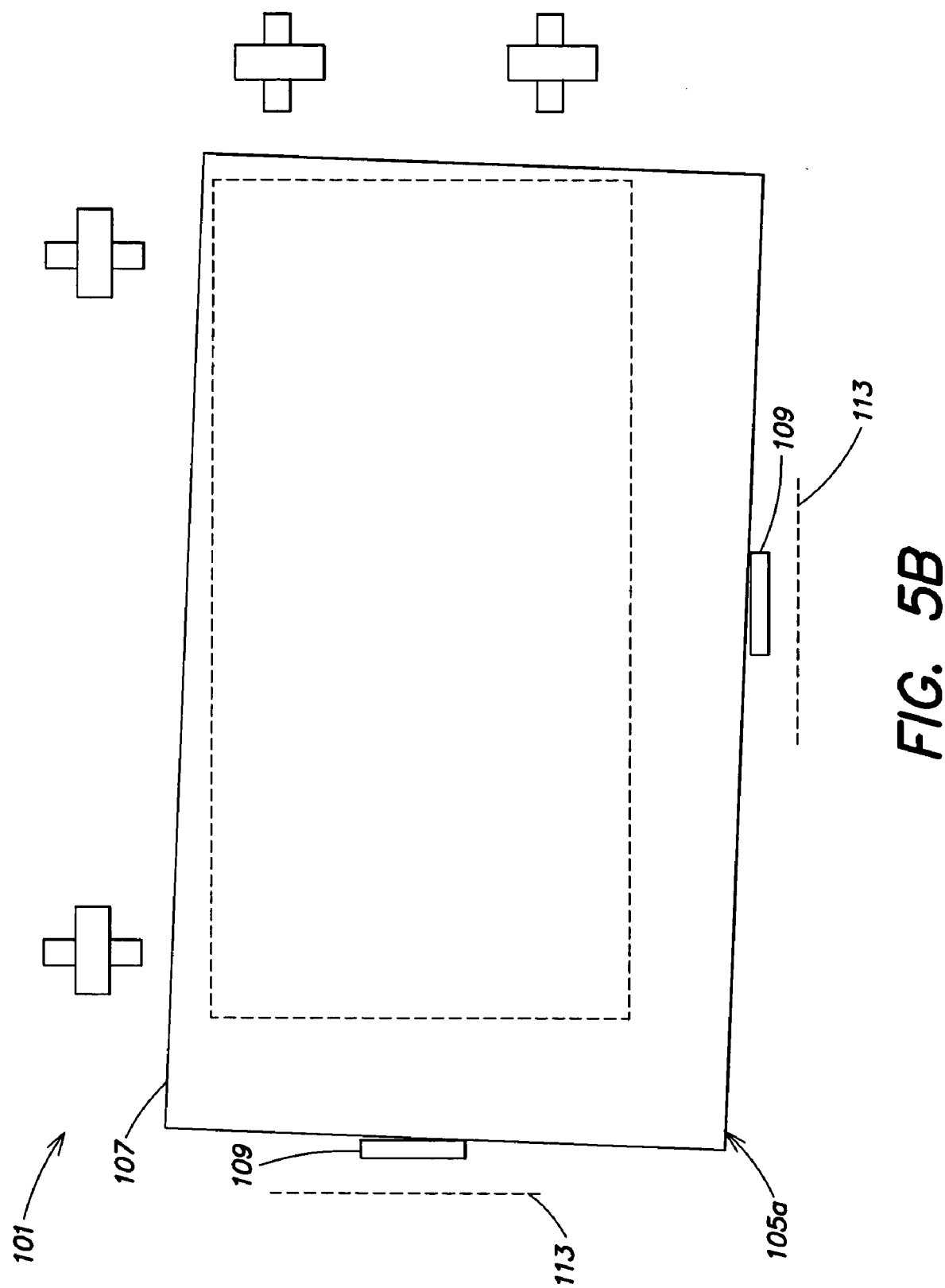
FIG. 5B is a schematic top view of the substrate positioning system of FIG. 5A wherein the configuration of the substrate positioning system is such that each pusher is in contact with the edge of the substrate.

FIG. 5B is a schematic top view of the substrate positioning system 101 of FIG. 5A wherein each pusher 109 is in contact with the edge 107 of the substrate 105a. In the exemplary embodiment of the substrate positioning system 101 shown in FIG. 5A, the orientation of each pusher 109 is fixed relative to the direction in which the pusher 109 extends from the retracted position 113 associated with that pusher 109. As such, at least the initial contact between each pusher 109 and the edge 107 of the substrate 105a is characterized by a misalignment between that pusher 109 and the portion of the edge 107 of the substrate 105a contacted by that pusher 109. (The orientation of each pusher 109 relative to a direction in which the pusher extends need not be fixed).

Figure 5C:
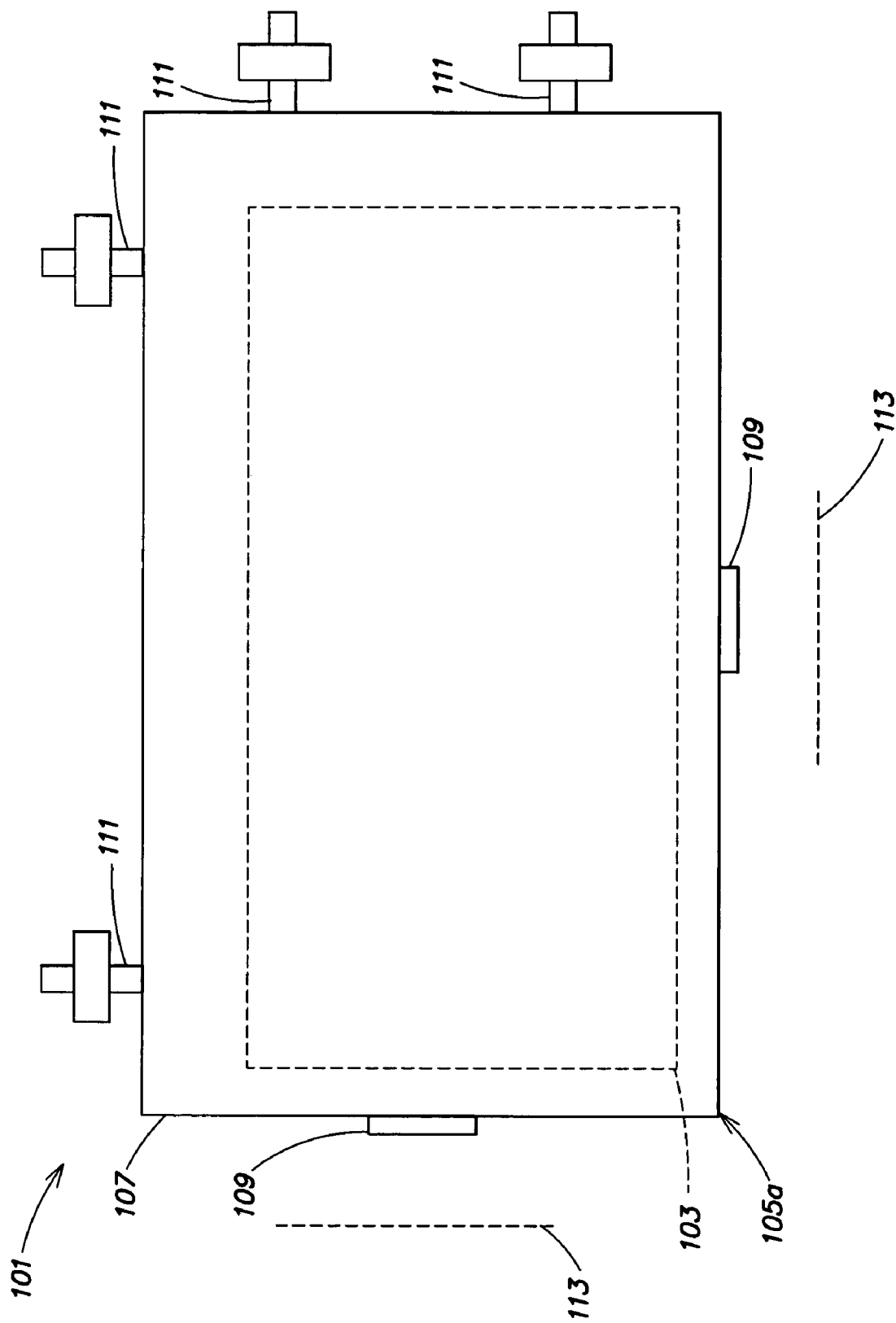
FIG. 5C is a schematic top view of the substrate positioning system of FIG. 5A illustrating a configuration of the substrate positioning system wherein the substrate, supported by the support stage, has been calibrated to the support stage.

FIG. 5C is a schematic top view of the substrate positioning system 101 of FIG. 5A wherein the substrate 105a, still supported by the support stage 103, has been calibrated to the support stage 103 by the substrate positioning system 101 such that the edge 107 of the substrate 105a is aligned with the predefined x-y coordinate system 115 (FIG. 1A) of the support stage 103. Referring to FIG. 5C, the misalignment relative to the support stage 103 that characterized the substrate 105a as shown in FIGS. 5A–5B is corrected. The exemplary embodiment of the substrate positioning system 101 illustrated in FIGS. 5A–5C permits sliding linear communication between each pusher 109 and the edge 107 of the substrate 105a, and permits sliding communication (e.g. sliding linear communication) between each stop 111 and the edge 107 of the substrate 105a, so as to adjust the overall orientation of the substrate 105a (e.g., allowing alignment of the edge 107 of the substrate 105a with the predefined x-y coordinate system 115 (FIG. 1A) of the support stage 103).

In the exemplary embodiment of the substrate positioning system 101 shown in FIG. 5A–5C, each pusher 109 may be subjected to a separate and unique biasing force, and adapted to extend in different directions of extension, as well as through different extension distances as necessary, such that substrates of differing sizes and/or proportions, and of differing degrees of initial orientation relative to the support stage 103, can be calibrated to the predefined x-y coordinate system 115 (FIG. 1A) of the support stage 103 to substantially the same degree of precision.

Figure 6:
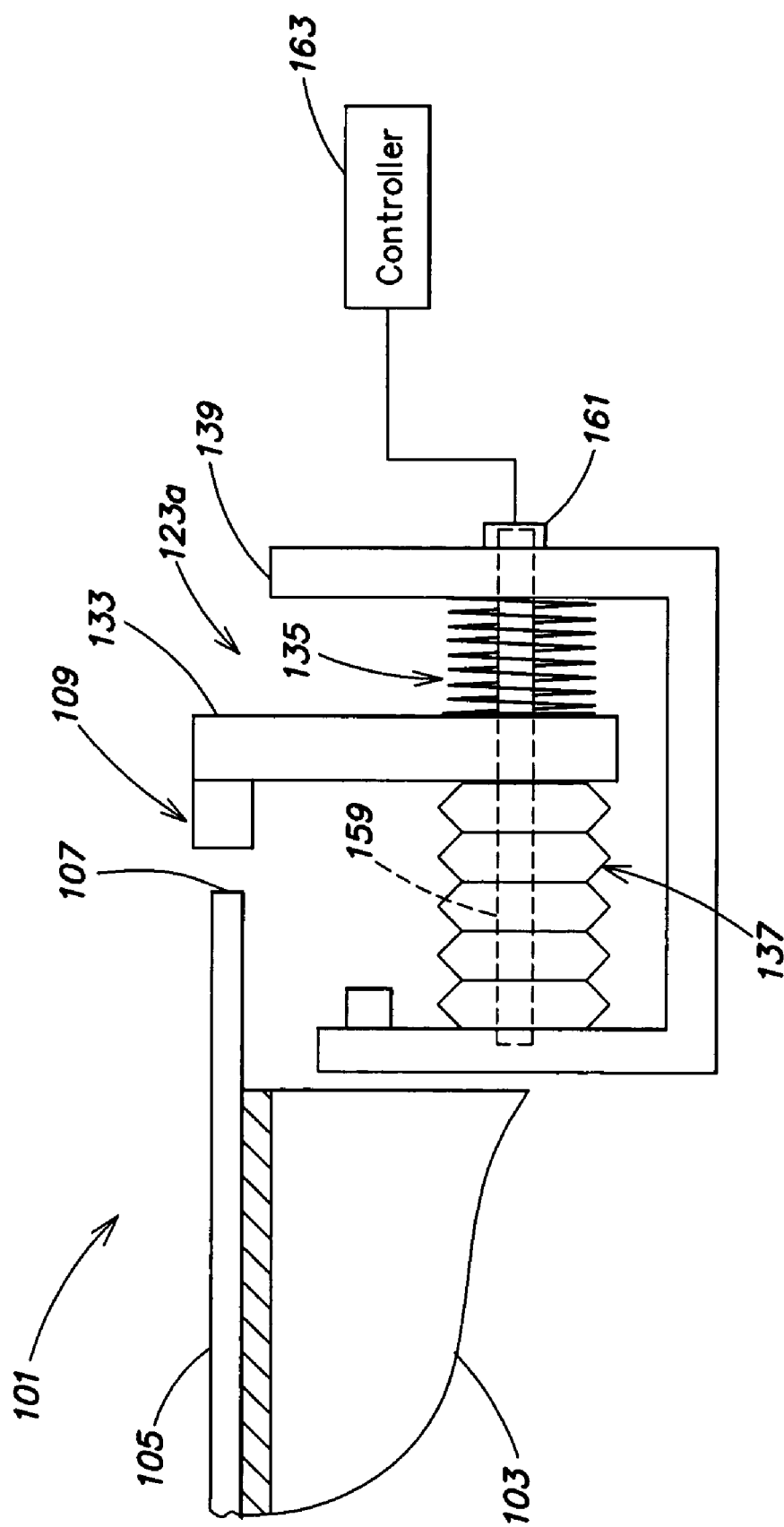
FIG. 6 is a schematic side elevational view of an alternative pushing device in accordance with the present invention.

FIG. 6 is a schematic side elevational view of an alternative pushing device 123a in accordance with the present invention. The pushing device 123a of FIG. 6 is similar to the pushing device 123 of FIG. 2. For example, the pushing device 123a comprises a pusher 109, a pusher support 133, a biasing device 135, a bias-defeating device 137 and a common frame 139, as does the pushing device 123 of FIG. 2. However the pushing device 123a further comprises a guideshaft 159 adapted to rotate (e.g., within bearings (not shown) in the common frame 139) and to support and guide the pusher support 133 as the pusher support 133 moves relative to the common frame 139 of the pushing device 123a. A sensor 161 may be provided, coupled to the common frame 139, for example, and adapted to generate a signal and/or signals corresponding to the speed of rotation and/or the rotational position of the guideshaft 159. The exemplary embodiment of FIG. 6 further comprises a controller 163 adapted to receive the signal and/or signals from the sensor 161 and to determine a position of the pusher 109 relative to the support stage 103 based thereon.

In the embodiment of FIG. 6, the biasing device 135 and the bias-defeating device 137 are aligned in common with the guideshaft 159 so as to encourage smooth motion of the pusher support 133 relative to the common frame 139, and/or to eliminate at least one source of torque in the pushing device 123a. The guideshaft 159 may comprise, for example, a lead screw or the like.

The foregoing description discloses only exemplary embodiments of the invention; modifications of the above disclosed apparatus and methods which fall within the scope of the invention will be readily apparent to those of ordinary skill in the art. For example, while the present invention has been described primarily with regard to adjusting the position of glass plates relative to a support stage, it will be understood that the present invention may be employed to adjust the position of other types of substrates.

Accordingly, while the present invention has been disclosed in connection with exemplary embodiments thereof, it should be understood that other embodiments may fall within the spirit and scope of the invention, as defined by the following claims.

The invention claimed is:

1. A substrate positioning system adapted to adjust a position of an edge of a substrate relative to a stage that supports the substrate, comprising:
    a plurality of pushing devices and stops arranged in a spaced relation around a stage that is adapted to support a substrate, wherein each stop occupies a fixed position relative to the stage and each pushing device comprises a movable pusher that is adapted to:
        extend toward an edge of the substrate that is supported by the stage;
        contact the edge of the substrate while the substrate is supported by the stage; and
        continue extending so as to cause the substrate to translate relative to the stage toward one or more of the stops until the substrate contacts the one or more stops;
    wherein each pushing device further comprises a biasing device coupled to the pusher of the pushing device and adapted to move the pusher toward the edge of the substrate; and
    wherein each pushing device further comprises a retracting device coupled to the pusher of the pushing device and adapted to counteract the biasing device so as to move the pusher away from the edge of the substrate.

2. The substrate positioning system of claim 1, wherein each pushing device is adapted to:
    cause the pusher of the pushing device to extend toward the edge of the substrate that is supported by the stage;
    cause the pusher of the pushing device to contact the edge of the substrate while the substrate is supported by the stage; and
    cause the pusher of the pushing device to continue extending so as to cause the substrate to translate relative to the stage toward one or more of the stops until the substrate contacts the one or more stops.

3. The substrate positioning system of claim 2 wherein:
    the pusher of each pushing device is further adapted to retract from the edge of the substrate; and
    each pushing device is further adapted to cause the pusher of the pushing device to retract from the edge of the substrate.

4. The substrate positioning system of claim 1 further comprising a controller coupled to each pushing device, and adapted to:
    cause the pusher of each pushing device to extend toward the edge of the substrate that is supported by the stage;
    cause the pusher of each pushing device to contact the edge of the substrate while the substrate is supported by the stage; and cause the pusher of each pushing device to continue extending so as to cause the substrate to translate relative to the stage toward one or more of the stops until the substrate contacts the one or more stops.

5. The substrate positioning system of claim 1, wherein each pusher is further adapted to extend toward the edge of the substrate along a straight-line path.

6. The substrate positioning system of claim 5, wherein the plurality of pushing devices reside in a common plane containing the straight-line paths of the pushers.

7. The substrate positioning system of claim 6, wherein the plurality of pushing devices include a first pushing device oriented such that the pusher of the first pushing device extends in a first direction, and a second pushing device oriented such that the pusher of the second pushing device extends in a second direction substantially perpendicular to the first direction.

8. The substrate postioning system of claim 1, wherein the biasing device comprises a spring.

9. The substrate positioning system of claim 1, wherein the retracting device comprises a bellows.

10. The substrate positioning system of claim 1, wherein the biasing device and the retracting device are coupled to a common frame.

11. The substrate positioning system of claim 1, wherein the stage is adapted to support glass substrates for flat panel displays.

* * * * *